US005179379A

United States Patent [19]
Allen et al.

[11] Patent Number: 5,179,379
[45] Date of Patent: Jan. 12, 1993

[54] ANALOG TO DIGITAL CONVERTOR WITH DRIFT COMPENSATION

[75] Inventors: Donald Allen, Hursley; Dominic Hill, Eastleigh, both of United Kingdom

[73] Assignee: International Business Machines Corporation, Armonk, N.Y.

[21] Appl. No.: 779,679

[22] Filed: Oct. 21, 1991

[30] Foreign Application Priority Data

Jan. 18, 1990 [EP] European Pat. Off. ........ 91300417.2

[51] Int. Cl.⁵ .............................................. H03M 1/06
[52] U.S. Cl. .................................... 341/118; 341/155
[58] Field of Search ................ 341/118, 119, 108, 115, 341/120, 121, 106

[56] References Cited

U.S. PATENT DOCUMENTS 4,618,848  10/1986  Parfitt ................................. 340/347

FOREIGN PATENT DOCUMENTS 0103468  9/1982  European Pat. Off. .
0201415  4/1986  European Pat. Off. .
3202497  1/1982  Fed. Rep. of Germany .

Primary Examiner—A. D. Pellinen
Assistant Examiner—Brian K. Young
Attorney, Agent, or Firm—Michael J. Balconi-Lamica

[57] ABSTRACT

An analog to digital convertor (20) comprises an amplifier (100) for amplifying an analog input signal to generate an amplified output signal. A conversion means (110) periodically samples the amplified output signal to generate a digital word as a function of each sample. A compensation means, preferably including a microcontroller logic circuit (130), compensates for drift in the output signal steady state level of the amplified output signal. The compensation means includes a tracking means (130) for summing a digital offset value and the digital word in response to, and to compensate for, the drift in the output signal level between upper and lower limits. The compensation means also includes a bias means (130,140) for changing a bias signal level at the input of the amplifier (100) in response to, and to compensate for, the drift extending beyond the limits. The compensation means further includes a logic means (130,190) for modifying the digital word in response to, and to compensate for, the step change.

6 Claims, 5 Drawing Sheets

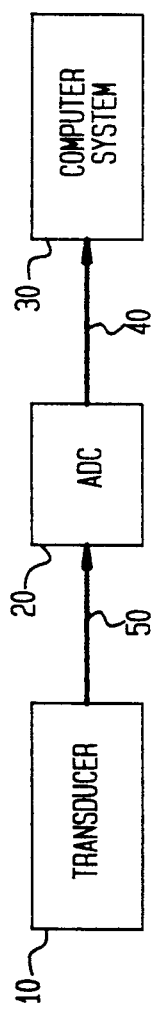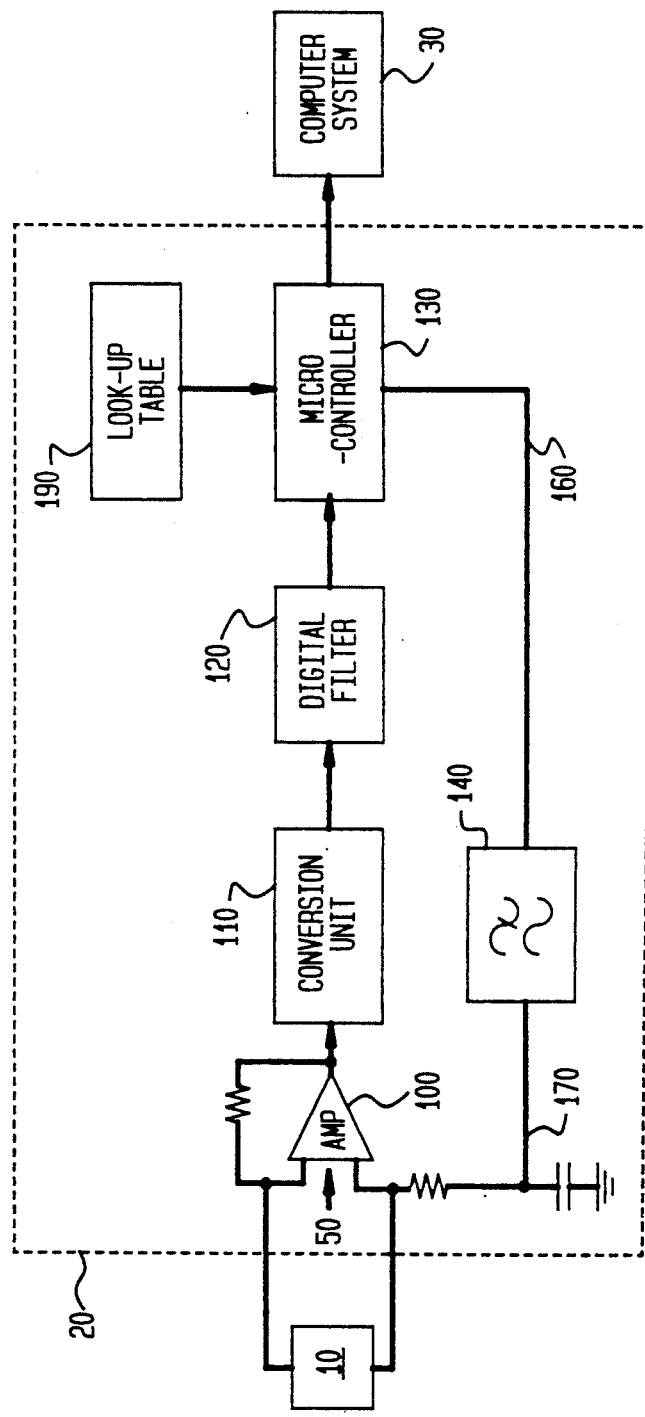

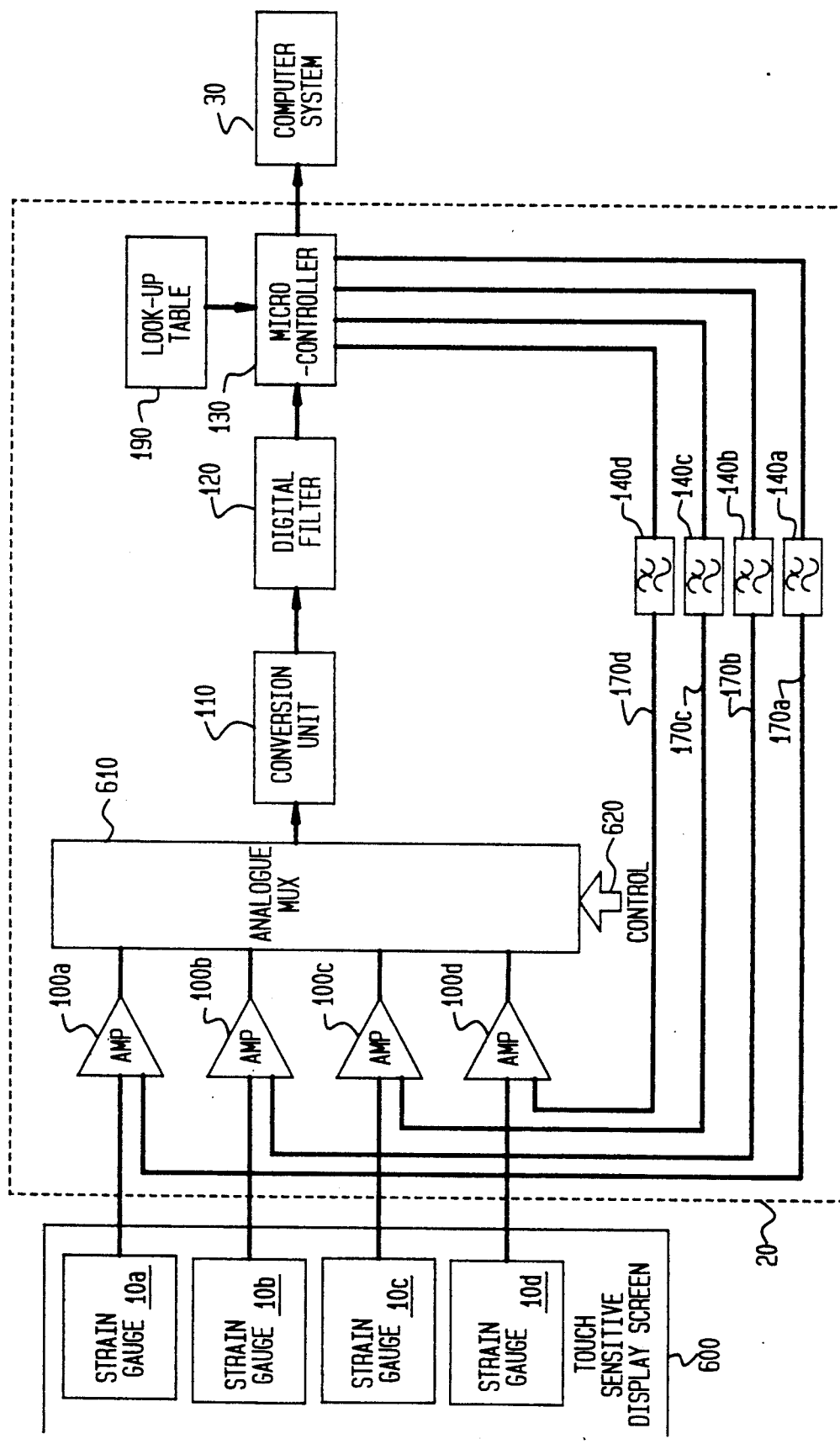

ANALOG TO DIGITAL CONVERTOR WITH DRIFT COMPENSATION

TECHNICAL FIELD

The present invention relates in general to analog to digital convertors, and in particular to an analog to digital convertor with signal drift compensation.

BACKGROUND ART

Conventional analog to digital convertors, such as those for digitising an analog input signal generated by a transducer (such as a strain gauge), generally include expensive high stability components arranged in complex circuits. The stability of the components is selected to minimize signal drift within the circuits, thereby providing an accurate digital representation of the analog input signal.

British Patent No. 2 077 537 A discloses a typical prior art analog to digital converter wherein a circuit for digitising an analog input signal is generated by a transducer such as a strain gauge. The circuitry comprises an analog to digital convertor connected to the output of the transducer by a semiconductor switch. The switch is controlled by a microprocessor which periodically changes over the switch so as to connect the analog to digital convertor input to a calibration signal derived from an energizing source. The microprocessor scales the output of the channel by a multiplying factor having a magnitude determined so that its product with the digitized calibration signal is always constant. Any drift at the input of the analog to digital convertor can therefore be compensated by changing the magnitude of the multiplying factor. This circuit, however, cannot continuously digitize an analog input signal because the input to the analog to digital convertor must be periodically disconnected from the input signal to compensate for input drift.

DISCLOSURE OF THE INVENTION

An object of the present invention is to provide an analog to digital convertor which can digitize an analog input signal and compensate for input drift simultaneously.

In accordance with the present invention, there is now provided an analog to digital convertor comprising: an amplifier responsive to an analog input signal for generating an amplified output signal; conversion means for periodically sampling the amplified output signal to generate a digital word as a function of each sample; compensation means responsive to, and compensating for, a drift in the output signal steady state level of the amplified output signal; characterised in that the compensation means comprises: tracking means for modifying the digital word in response to, and to compensate for, the drift in the output signal level between upper and lower limits; bias means connected to the amplifier for changing a bias signal level of the analog input signal in response to, and to compensate for, the drift in the output signal level extending beyond either of the limits; and logic means for modifying the digital word in response to, and to compensate for, the step change.

The present invention provides an analog to digital convertor in which undesirable DC signal level drifts are compensated for by two interrelated digital processes. Specifically, when the signal level drift is between an upper and lower limit, a digital offset tracks and is subtracted from the drift so that no drift is apparent at the digitized output of the analog to digital convertor. However, when the drift extends beyond either of the limits, a bias level at the input of the analog to digital convertor is adjusted. This generates a step input which is compensated for at the digitized output by forcing a change in the digital offset independently of the tracking means. The digitized output can therefore be corrected without interrupting the continuous digitisation of an analog input signal.

BRIEF DESCRIPTION OF THE DRAWINGS

Preferred embodiments of the present invention will now be described, by way of examples only, with reference to the accompanying drawings in which:

FIG. 1 is a block diagram of a measurement system including an analog to digital convertor, in accordance with the present invention.

FIG. 2 is a block diagram of an analog to digital convertor in accordance with the present invention.

FIG. 7 is a block diagram of a multi-channel measurement system comprising an analog to digital convertor in accordance with the present invention.

BEST MODE FOR CARRYING OUT THE INVENTION

Figure 3:
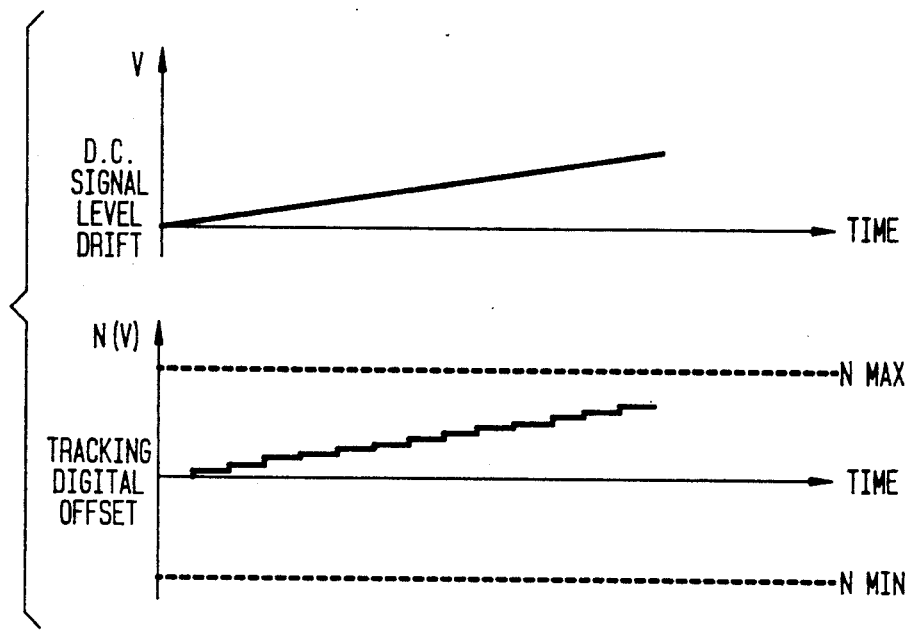
FIG. 3 is a graph of a digital offset generated by the analog to digital convertor for correcting a DC signal level drift within the analog to digital convertor in accordance with the present invention.

Referring now to FIG. 1, a measurement system of the present invention comprising a transducer 10 (such as a resistive strain gauge) generates an analog input signal 50 in response to an applied stimulus (not shown). The input signal 50 is periodically sampled, and each sample is converted into a digital word 40 by an analog to digital convertor (ADC) 20. A computer system 30 reads the digital words 40 to analyze the stimulus applied to the transducer 10.

Referring now to FIG. 2, a preferred example of an ADC in accordance with the present invention comprises an amplifier 100 for amplifying the input signal 50 from the transducer 10. In this example, the transducer 10 is a strain gauge. A conversion unit 110 periodically samples the output from amplifier 100 and converts each sample into a separate digital word. Any high frequency noise in the input signal is encoded into each digital word as spurious data bits. A digital filter 120 having a low frequency pass band removes the spurious data bits from each word. In a preferred embodiment of the present invention, the digital filter 120 has a Bessel transfer function. However, it will be appreciated that other examples of the present invention may comprise digital filters having other transfer functions such as Chebyshev or Butterworth transfer functions.

The DC level at the input of the conversion unit 110 may drift in response to, for example, component temperature changes within the amplifier 100. A microcontroller logic circuit 130 subtracts a digital offset from each digital word at the output of the digital filter to compensate for the drift. With reference to FIG. 3, the magnitude of the digital offset tracks the magnitude of the drift with time. This maintains the output of the microcontroller 130 at a zero level unless a stimulus is applied to the strain gauge 10.

The digital offset has a fixed digital word length defining the maximum correctable drift. When the magnitude of the drift becomes too great for the digital offset to correct, the microcontroller changes a DC bias level 170 to the input of the amplifier 100. The bias level 170 is generated from a pulse width modulated (PWM) signal 160. The PWM signal 160 is generated by the microcontroller 130. A low pass filter 140 generates the bias level as a function of the duty cycle of the PWM signal 160. A change in the duty cycle of the PWM signal generates a corresponding step change in the bias level. This produces a step change at the input of the conversion unit 110.

Figure 4:
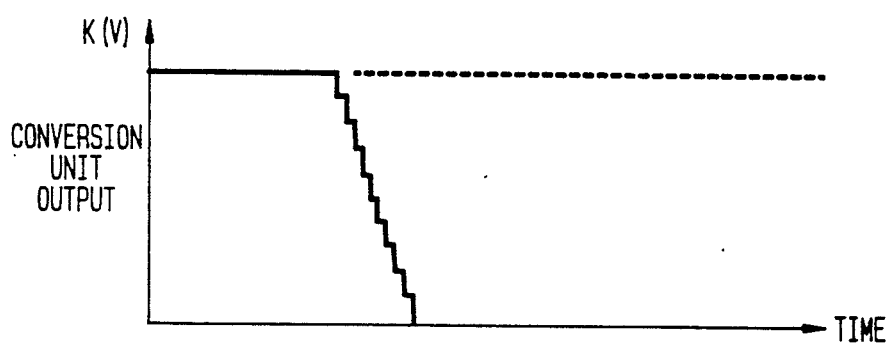
FIG. 4 is a graph of the output from a conversion unit of the analog to digital convertor responding to a step change in DC bias level at the input of the analog to digital convertor in accordance with the present invention.
Figure 5:
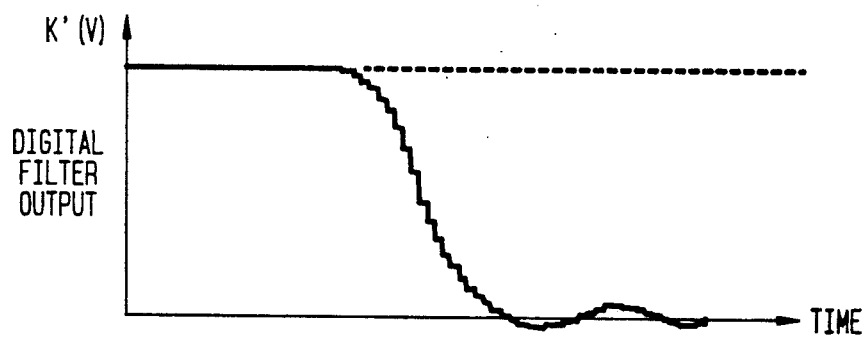
FIG. 5 is a graph of the output from a digital filter of the analog to digital convertor responding to the step change in accordance with the present invention.

Referring now to FIG. 4, the conversion unit 110 converts this step change into a sequence of digital words as if it were generated in the strain gauge 10. FIG. 5 shows the corresponding sequence of digital words at the output of the digital filter 120. The step change may thus provide the computer system 30 with false input data.

The microcontroller 130 of the ADC 20 of the present invention corrects the step change at the output of the digital filter 120 by adjusting the digital offset. Specifically, the microcontroller 130 either adds to or subtracts from the output of the digital filter 120 a different predetermined digital compensation value for each consecutive digital word encoded during the step change. The compensation values are stored in an array within a look up table 190. Each compensation value in the array corresponds to a different digital word encoded during the step change.

Each compensation value corresponds to the difference between two adjacent digitized samples of a nominal unit step change of, for example, 32. In operation, when the digital offset reaches a maximum for example, the microcontroller 130 generates a step change in the DC bias level 170 at the input of the amplifier 100 from a higher level to a lower level. For each successive digital word encoded during the step change, a corresponding compensation value is subtracted from digital offset. The digital offset is thus decreased from its initially maximum value in increments determined by the compensation values corresponding to the successive samples of the step change. For each successive sample, the microcontroller logic circuit 130 subtracts the digital offset from the digital word at the output of the digital filter. This maintains the output of the microcontroller 130 at a zero level during the step change unless a stimulus is applied to the strain gauge 10, in which case the computer system 30 detects only the stimulus.

Figure 6:
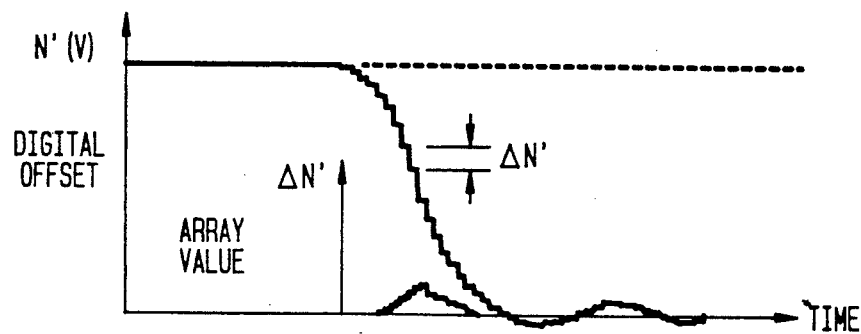
FIG. 6 is a graph of the digital offset generated by the analog to digital convertor in response to the step change in accordance with the present invention.

FIG. 6 illustrates the digital offset decreasing with time from a maximum value in response to a step change in the DC bias level from a higher level to a lower level. The compensation values produce a decrease in the digital offset which inversely corresponds to the response of the digital filter to the step change. It will be appreciated that the compensation values are added to the digital offset after the digital offset reaches a minimum.

The number of compensation values in the array are preselected to provide adequate compensation at the lowest operating frequency of the digital filter. In a preferred embodiment of the present invention, the array consists of 64 compensation values corresponding to 64 successive samples of the step change. The look up table 190 is preferably kept small for storage by limiting the range of the compensation values in the array. In a preferred example of the present invention, the values are limited to four bit nibbles within the range +7 to −7. The array is therefore 32 bytes wide. The look up table 190 is preferably stored in a random access memory.

The step response at the output of the digital filter 120 can vary between different ADCs as a function of electrical component tolerances. If the look up table in such ADCs is stored in permanent form in a read only memory, the correction of the step change provided by the array of compensation values also varies as a function of the electrical component tolerances. Conveniently, the ADC 20 of the present invention can be self-calibrating on power up. During self-calibration, the digital offset is disabled and a step change in the DC bias level 170 is generated by the microcontroller 130. The corresponding steady state change in the output of the digital filter 120 is divided by the nominal step unit change to generate a gain factor. Each compensation value in the array is then multiplied by the gain factor to correct for the component variations.

The microcontroller 130 in the ADC 20 of the present invention can correct for an input step change which is a multiple of the nominal unit step change. When such a step change is detected, the microcontroller determines the multiple by dividing the magnitude of the detected step change by the nominal unit step change. Each compensation value is then multiplied by the product of the multiple and the gain factor. The modified compensation values are then subtracted from the digital words at the output of the digital filter.

FIG. 7 shows an example of a multi-channel measurement system in the form of a touch sensitive display screen 600 connected to the computer system 30 via an ADC 20 of the present invention. The ADC 20 comprises four input channels connected to four strain gauges 10a,b,c,d of the touch sensitive display screen 600. The input channels comprise amplifiers 100a,b,c,d connected to the outputs of the strain gauges 10a,b,c,d. A multiplexor 610 selectively connects any one of the outputs of the amplifiers 100a,b,c,d to the input of the conversion unit 110 in response to a control code 620 provided by the computer system 30. Each amplifier 100a,b,c,d may have a different transfer function to the others depending on electrical component tolerances. Typically, these tolerances produce corresponding variations in the output of the digital filter in the range +25% to −25%. Therefore, when the system is powered up, a different gain factor is calculated for each of the four input channels. Each compensation value in the array is then multiplied by the gain factor corresponding to the input channel to which the multiplexor is switched. Compensation for a step change in any selected one of the input channels can therefore be provided using a single array of compensation values. A separate array for each input channel is not required.

The array of compensation values requires refreshment when the break point frequency or the transfer function of the digital filter 120 is changed. Therefore, the array can be refreshed automatically after a change is made to the digital filter 120. During refreshment, the microcontroller 130 disables the step compensation of the output of the digital filter. A step change which is typically 10 times greater than the nominal unit step change is applied to the input of the amplifier 100. The digital words corresponding to a sequence of 64 consecutive samples of the step change are monitored at the output of the digital filter 120. 64 replacement compensation values are determined from the 64 digital words and stored in the array. Specifically, each compensation value is determined by calculating the difference between two successively encoded digital words and dividing the difference by the nominal unit step change.

Figure 8A:
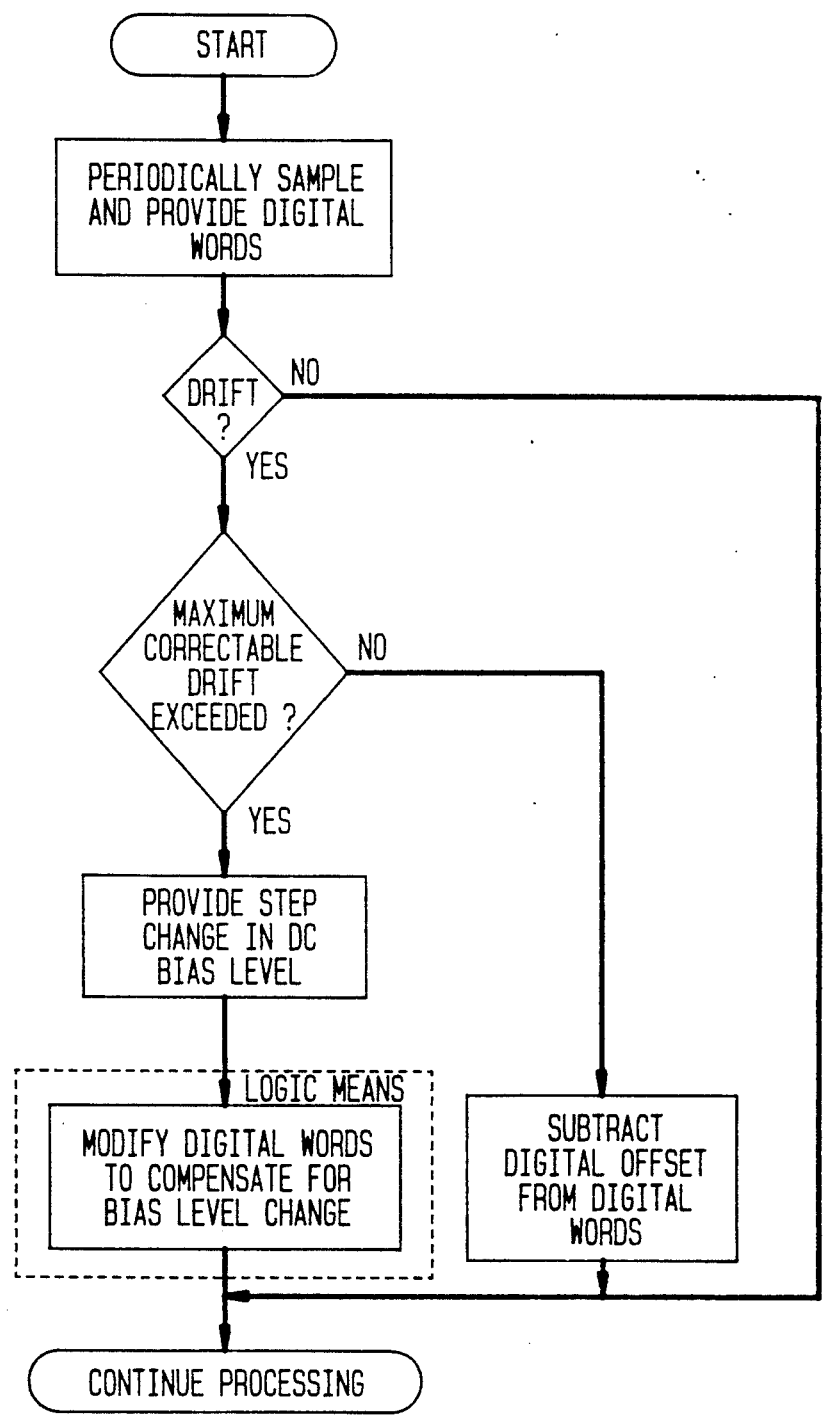
FIGS. 8a and 8b show flow diagrams of the conversion procession in accordance with the present invention.
Figure 8B:
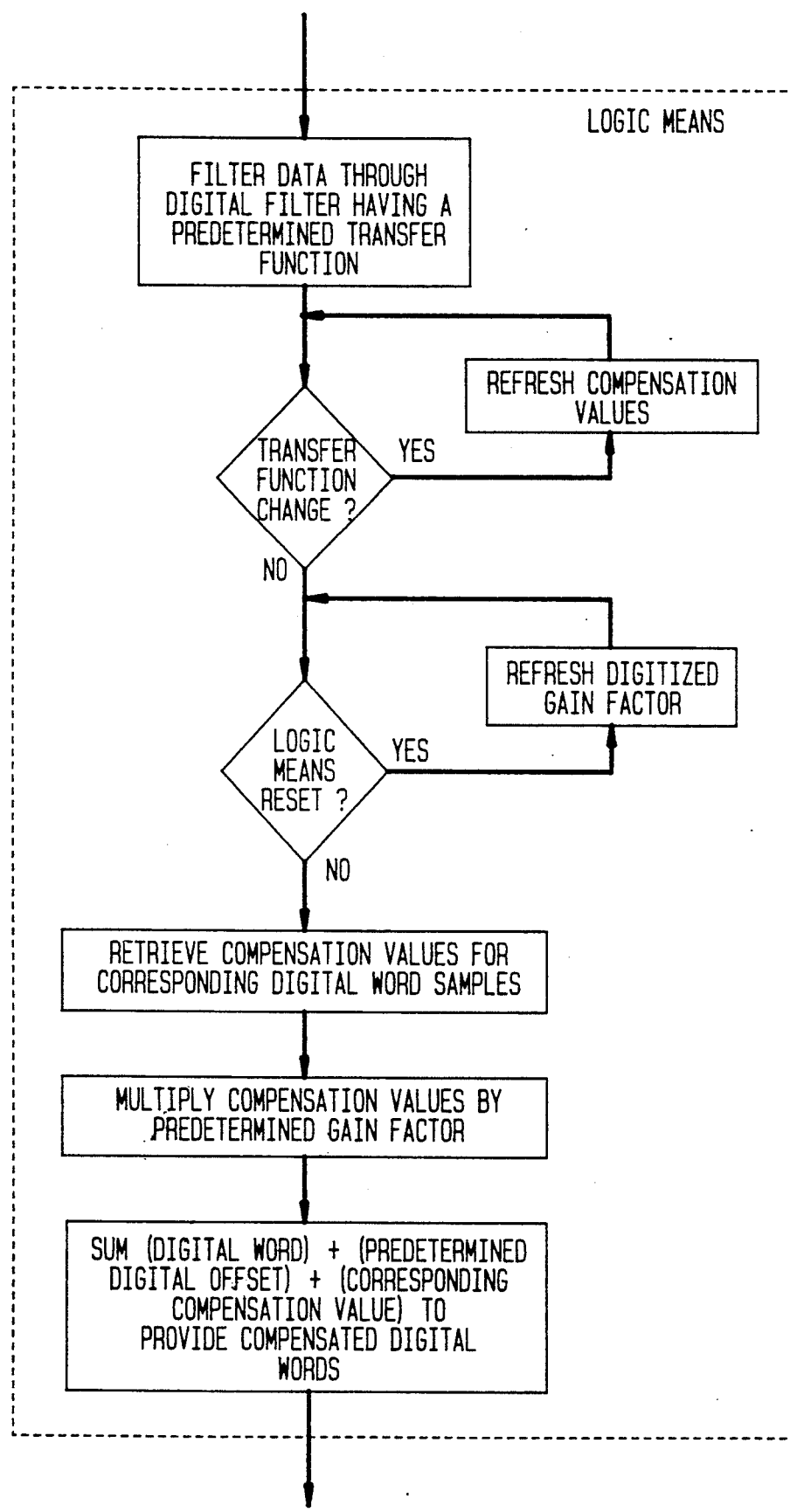

An example of an ADC 20 having a microcontroller 130 in the form of a logic circuit has now been described. It will however be appreciated that the microcontroller 130 may also be implemented by a microprocessor or the like operating under the control of a computer program as shown in FIGS. 8a and 8b. Furthermore, preferred examples of the present invention have now been described with reference to a measurement system comprising an electrical transducer in the form of a strain gauge. It will be appreciated that the present invention is equally applicable to other measurement systems comprising different electrical transducers such as temperature gauges or pressure gauges.

We claim:

1. An analog to digital convertor comprising:
    amplifier means responsive to an analog input signal for providing an amplified output signal;
    conversion means responsive to said amplified output signal for providing a digital signal as a function of said amplified output signal by periodically sampling said amplified output signal and providing a digital word as a function of each sample;
    compensation means responsive to drift in the steady state level of said digital signal for providing a compensated signal, said compensation means having:
        tracking means responsive to drift in the steady state level of said digital signal which is between predetermined upper and lower limits for summing a predetermined digital offset value with said digital signal in order to negate the drift of said amplified output signal;
        bias means connected to said amplifier and responsive to drift in the steady state level of said digital signal for providing a bias level change to said analog input signal in order to bring the steady state level of said digital signal within said predetermined limits; and,
        logic means responsive to said bias level change for modifying said digital signal in order to compensate for said bias level change, wherein said logic means comprises:
            memory means for storing an array of compensation values corresponding to consecutive samples of said bias level change;
            summing means responsive to said digital signal and said compensation values for providing said compensated signal as the sum of: a) each consecutive said digital word corresponding to each consecutive sample of said bias level change; b) said predetermined digital offset value; and, c) said corresponding compensation value stored in said array for each consecutive sample of said bias level change; and
            multiplying means for multiplying each said compensation value by a predetermined digitized gain factor stored in said memory.

2. An analog to digital convertor in accordance with claim 1, wherein said logic means further comprises:
    digital filter means responsive to said digital signal for filtering said digital signal in accordance with a predetermined transfer function and for providing a filtered digital signal to said logic means; and,
    first refreshing means responsive to changes in said transfer function for refreshing each compensation value in said memory array for changes in said transfer function.

3. An analog to digital convertor in accordance with claim 2, wherein said logic means further comprises:
    second refreshing means responsive to resets of said logic means for refreshing said digitized gain factor when said logic means is reset.

4. An analog to digital convertor in accordance with claim 1, 2, or 3, wherein said bias means comprises:
    low pass filter means for providing said bias level in response to the duty cycle of a pulse width modulated signal.

5. An analog to digital convertor in accordance with claim 2 or 3, further comprising:
    a plurality of analog input channels, each of said plurality of analog input channels comprising: a) transducer means for providing an analog input signal; b) amplifier means responsive to said analog input signal for providing an amplified analog input signal as a function of said analog input signal;
    multiplexor means having a multiplexor output, said multiplexor means responsive to a control signal for providing a selective said amplified analog input signal at said multiplexor output;
    second memory means for storing an array of said digitized gain factors, each said digitized gain factor stored corresponding to one of each of said plurality of analog input channels; and,
    wherein said conversion means is responsive to said multiplexor output, and said logic means further comprises selecting means for selecting a selective gain factor from said array in response to said control signal.

6. An analog to digital convertor in accordance with claim 5, wherein said transducers are strain gauges of a touch sensitive display screen.

* * * * *